United States Patent
Cali et al.

(10) Patent No.: US 10,404,209 B2
(45) Date of Patent: Sep. 3, 2019

(54) COMPENSATING FOR THERMAL LAG IN TEMPERATURE COMPENSATED CRYSTAL OSCILLATORS

(71) Applicant: Silicon Laboratories Inc., Austin, TX (US)

(72) Inventors: Joseph D. Cali, Nashua, NH (US); Rajesh Thirugnanam, Nashua, NH (US); Rahul Shukla, Hopkinton, MA (US); Srisai R. Seethamraju, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 94 days.

(21) Appl. No.: 15/259,897

(22) Filed: Sep. 8, 2016

(65) Prior Publication Data

US 2018/0069553 A1    Mar. 8, 2018

(51) Int. Cl.
| | |
|---|---|
| G01J 5/00 | (2006.01) |
| G05D 23/20 | (2006.01) |
| G08B 13/18 | (2006.01) |
| G08B 27/00 | (2006.01) |
| H03B 5/32 | (2006.01) |
| H03L 1/02 | (2006.01) |
| H03L 7/197 | (2006.01) |

(52) U.S. Cl.
CPC ............. H03B 5/32 (2013.01); H03L 1/027 (2013.01); H03L 7/1974 (2013.01)

(58) Field of Classification Search
CPC ......... H03L 1/04; H03L 1/027; H03L 7/1974; H03B 5/32

USPC .................................................... 331/66, 176
See application file for complete search history.

(56) References Cited

U.S. PATENT DOCUMENTS

| | | | |
|---|---|---|---|
| 4,560,959 A | 12/1985 | Rokos | |
| 4,851,789 A | 7/1989 | Dobos | |
| 4,906,944 A | 3/1990 | Frerking | |
| 5,081,431 A | 1/1992 | Kubo | |
| 5,182,528 A | 1/1993 | Zuta | |
| 6,271,736 B1 * | 8/2001 | Kim | H03L 1/026 |
| | | | 331/116 FE |
| 6,549,082 B2 | 4/2003 | Ipek et al. | |
| 6,784,756 B2 | 8/2004 | Villella | |
| 6,888,763 B1 | 5/2005 | Guo | |

(Continued)

OTHER PUBLICATIONS

U.S. Appl. No. 15/261,239, filed Sep. 9, 2016, entitled "Compensating for Temperature-Dependent Hysteresis in a Temperature Compensated Crystal Oscillator," naming Srisai Seethamraju et al. as inventors.

(Continued)

*Primary Examiner* — Richard Tan
(74) *Attorney, Agent, or Firm* — Zagorin Cave LLP

(57) ABSTRACT

A temperature compensated crystal oscillator (TCXO) includes a crystal oscillator and a temperature sensor to provide a sensed temperature. A delay circuit has a selectable delay to delay the frequency compensation based on the sensed temperature. The delay compensates for a difference between when the temperature sensor reflects a change in temperature and when a frequency of a signal supplied by the crystal oscillator is affected by the change in temperature. The delay may be static or dynamic with respect to the current temperature sensed by the temperature sensor.

12 Claims, 6 Drawing Sheets

(56) References Cited

U.S. PATENT DOCUMENTS

| | | | |
|---|---|---|---|
| 7,525,392 B2 | 4/2009 | Tarng | |
| 9,356,606 B2 | 5/2016 | Caffee | |
| 9,602,110 B1 | 3/2017 | Caffee | |
| 2001/0017574 A1* | 8/2001 | Oka | H03L 1/023 331/116 R |
| 2001/0022539 A1* | 9/2001 | Jakobsson | H03J 1/0058 331/172 |
| 2002/0011902 A1 | 1/2002 | Ipek et al. | |
| 2003/0197567 A1 | 10/2003 | Villella | |
| 2005/0128017 A1 | 6/2005 | Meltzer | |
| 2006/0022763 A1* | 2/2006 | Kato | H03B 5/04 331/176 |
| 2006/0071718 A1 | 4/2006 | McCorquodale | |
| 2010/0237955 A1 | 9/2010 | Mohooti | |
| 2010/0265000 A1* | 10/2010 | Kishi | H03L 1/025 331/176 |
| 2012/0286880 A1 | 11/2012 | Kowada | |
| 2013/0320955 A1 | 12/2013 | Kratyuk et al. | |
| 2014/0176251 A1 | 6/2014 | Seth et al. | |
| 2014/0247095 A1* | 9/2014 | Edwards | H03L 1/02 331/176 |
| 2015/0145607 A1 | 5/2015 | Caffee | |
| 2015/0285691 A1 | 10/2015 | Caffee et al. | |

OTHER PUBLICATIONS

Stakvik, J., "Identification, Inversion and Implementation of the Preisach Hysteresis Model in Nanopositioning," NTNU-Trondheim Norwegian University of Science and Technology, Jun. 2014, 169 pages.

\* cited by examiner

COMPENSATING FOR THERMAL LAG IN TEMPERATURE COMPENSATED CRYSTAL OSCILLATORS

BACKGROUND

Field of the Invention

This invention relates to temperature compensated crystal oscillators and more particularly to accounting for thermal lag between the temperature sensing mechanism driving compensation and the associated crystal.

Description of the Related Art

Crystal oscillators are frequently used to provide a stable frequency source. However, crystal oscillators' frequency stability is affected by temperature and thus temperature compensated crystal oscillators (TCXOs) are utilized to make the frequency supplied by the TCXO more stable in the presence of temperature variations.

FIG. 1 illustrates a high level block diagram of a TCXO 100 that includes a crystal oscillator (XO) 101 (including a crystal and oscillator sustaining circuitry) and a fractional-N phase locked loop (PLL) 103 that receives as an input the crystal oscillator output and supplies a PLL output signal 104. A temperature sensor 105 senses temperature and provides temperature data to a temperature compensation circuit 107 that in turn causes a feedback divider control circuit 109 to adjust the feedback divider 111 to correct for the expected frequency variation resulting from temperature variation. The temperature compensation circuit 107 may utilize a look-up table mapping the sensed temperature to the frequency variation or a polynomial extracted from the sensed temperature and measured frequency variation profile. The temperature compensation values in the look-up table or the polynomial coefficients may be based on device characterization in which the TCXO was heated to various temperatures in order to determine the appropriate compensation factors.

While FIG. 1 provides one way to temperature compensate a crystal oscillator further improvements in TCXOs are desirable to provide even more stable output signals.

SUMMARY OF EMBODIMENTS OF THE INVENTION

Accordingly, in one embodiment, a method for compensating for temperature change in a temperature compensated crystal oscillator includes sensing a temperature in a temperature sensor and delaying application of temperature-dependent frequency compensation based on the sensed temperature using a delay circuit having a selectable delay. The delay may be static or dynamic with respect to the current temperature. The selectable delay is chosen based on a time lag between when the temperature is sensed and when the temperature affects a crystal used in the crystal oscillator.

In another embodiment, a temperature compensated crystal oscillator (TCXO) includes a crystal oscillator and a temperature sensor to provide a sensed temperature. A delay circuit has a selectable delay to delay temperature-dependent frequency compensation based on the sensed temperature. The delay is to compensate for a difference between when the temperature sensor reflects a change in temperature and when a frequency of a signal supplied by the crystal oscillator is affected by the change in temperature.

In another embodiment a temperature compensated crystal oscillator (TCXO) includes a crystal oscillator and a temperature sensor to provide a sensed temperature. The TCXO further includes means for delaying temperature-dependent frequency compensation based on the sensed temperature to account for a difference between when the temperature sensor reflects a change in temperature and when a frequency of a signal supplied by the crystal oscillator is affected by the change in temperature. The means for delaying may include a memory storing temperature data and a selector circuit to select a location in memory to provide temperature data for use in temperature compensation.

DETAILED DESCRIPTION

Figure 1:
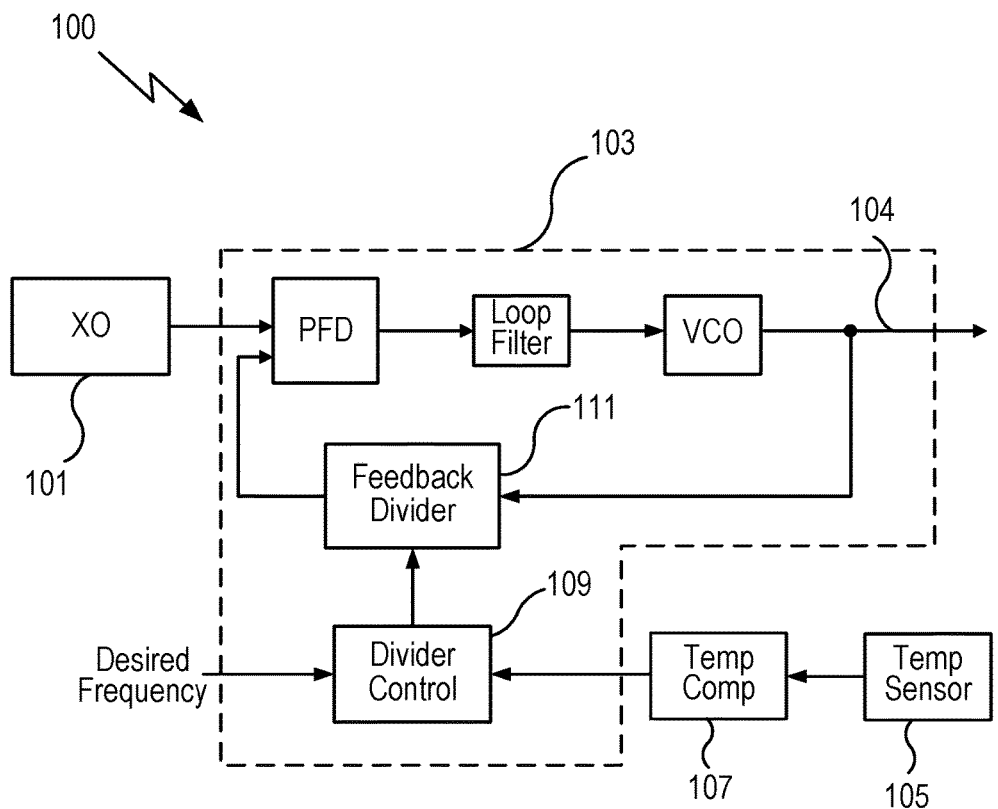
FIG. 1 illustrates a prior art temperature compensated crystal oscillator.
Figure 2:
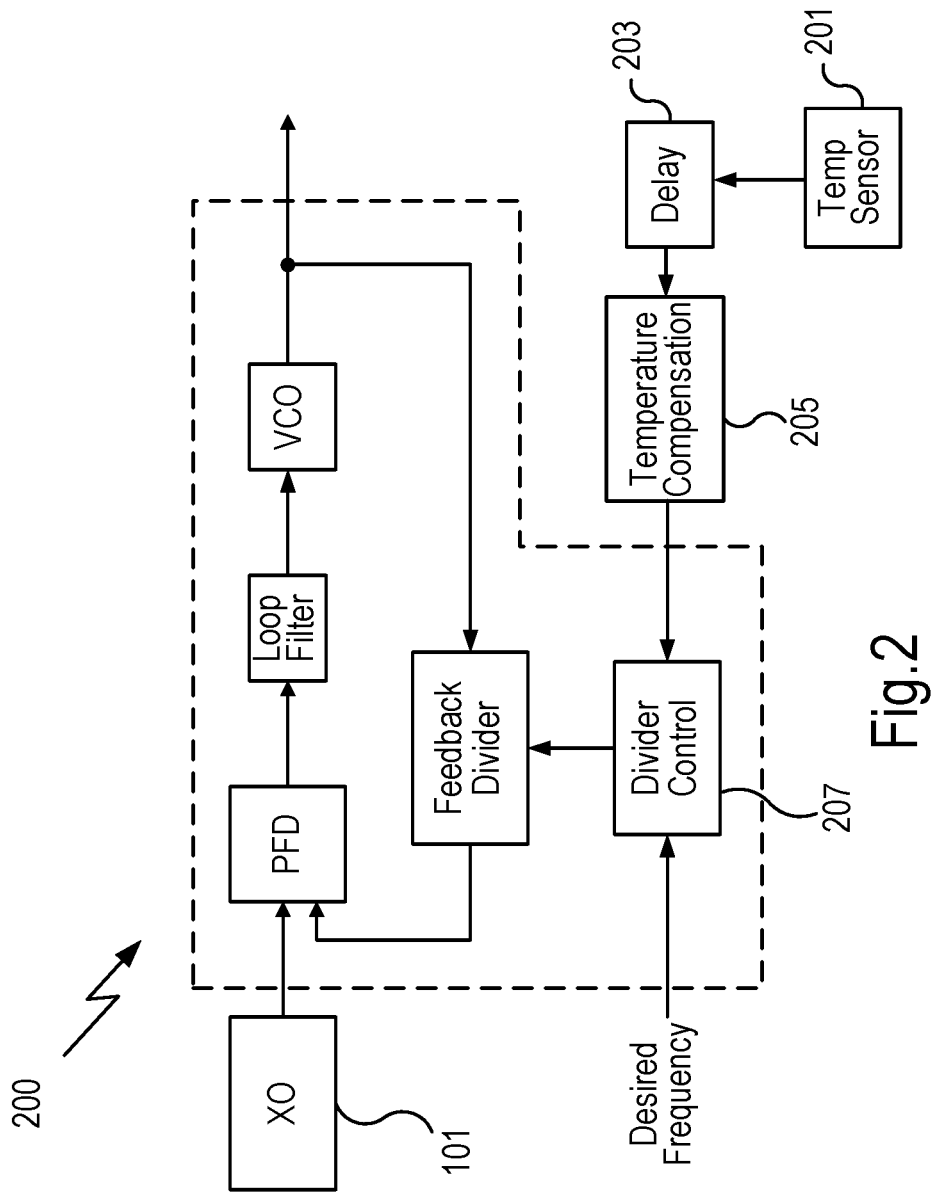
FIG. 2 illustrates a high level block diagram of a temperature compensated crystal oscillator according to an embodiment.

A temperature compensated crystal oscillator (TCXO) such as shown in FIG. 1 may be packaged in a such a way that the integrated circuit providing the active circuitry and compensation for oscillating the crystal resonator exhibits a different thermal response to the environment with respect to time than the XO. In a feed-forward compensation system thermal time lag between components can be characterized a priori and emulated on the chip to minimize deterministic frequency error caused by the lag. Embodiments herein describe a digital circuit capable of compensating for the delay in a feed-forward compensation system. Referring to FIG. 2, a high level block diagram illustrates the delay compensation approach for an embodiment of a TCXO 200. The temperature sensor 201 supplies a temperature data to a delay block 203 that delays the data before it is provided to temperature compensation block 205. The delay block 203 accounts for the lag between when the on-die temperature sensor senses a temperature change and when the crystal is affected by the sensed temperature change. As explained further herein, the delay may be static or dynamic. The output of the delayed compensation may be utilized, e.g., in a PLL such as shown in FIG. 2 or in a TCXO in which the temperature compensation is implemented differently. Note that the delay could optionally be placed between temperature compensation block 205 and divide control block 207.

Figure 3A:
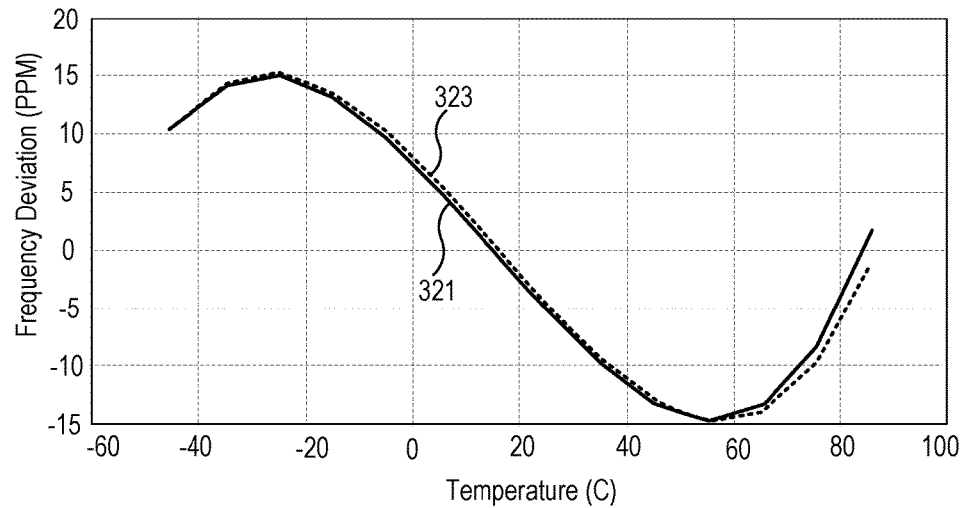
FIG. 3A shows a graph illustrating the frequency response of two XOs to temperature.
Figure 3B:
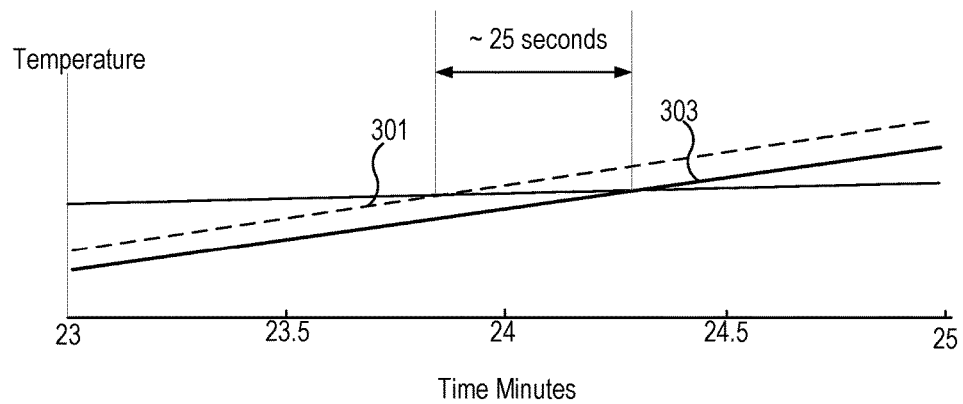
FIG. 3B shows a graph illustrating the delay between measured temperature change and when that temperature change effects the output of the XO.

The delay compensation described herein provides an efficient discrete-time digital implementation to a complex continuous-time analog problem. Because the clock from the crystal exhibits good frequency stability, the delay compensation in digital is well-defined and in one embodiment as described further herein is controlled by programming filter coefficients. FIG. 3A shows how frequency changes for two different crystals in parts per billion from a nominal frequency in response to change in temperature. As can be seen by the two curves 321 and 323 representing the two crystals in FIG. 3A, the example shows that crystals react differently to the thermal changes. In addition, there may be a delay between when the temperature sensor senses that temperature has changed and the change in frequency exhibited by the crystals as shown in FIG. 3A. The delay between the crystal and the die can be characterized for each individual part as part of a production run without varying the oven temperature. That makes the characterization suitable for a production test environment and quite efficient. FIG. 3B illustrates the lag between measured temperature 301 and the estimated XO temperature 303 based on frequency of the XO. As can be seen, there is approximately a 25 second lag between when the temperature is sensed by the on-die sensor and the temperature change affects the XO frequency. It is that lag that embodiments described herein are trying to address. If the temperature compensation was provided as soon as the on-die temperature sensor sensed the temperature, the temperature compensation would be applied before the thermal change was actually experienced by the crystal, making the output frequency of the XO less accurate.

The approach used to characterize the delay can utilize: (1) a frequency source with better temperature stability than the uncompensated XO, (2) a high accuracy frequency measurement tool (such as an on-die counter), (3) a way to locally measure the temperature of the die, and (4) a method for controlling the temperature of the operating environment (such as an oven).

In characterizing the thermal lag, the XO's static temperature profile may be measured by changing the temperature of the oven over the operating range and allowing the thermal transients to settle. That data may be used to create a map between the crystal frequency and the ambient temperature. Multiple techniques can be used to extract the relationship between the crystal and the die. Rapid temperature/frequency measurements may be made in a dynamic temperature environment. "Rapid" means frequent enough to meet the Nyquist sampling theorem for the delay under investigation. That is generally easy to meet since thermal time-constants are much longer than electrical time-constants. The dynamic temperature environment can be a temperature impulse event created by adjusting power supplies, turning on-off parts of the chip, etc. Another scenario could be a temperature step applied by an oven with the resulting lag shown in FIG. 3B. It could also be the device simply responding to the ambient temperature changes in the environment, e.g., responding to a building's air conditioning. The room temperature approach should be noted for its cost effectiveness (no oven required), but it does not allow separate cold/hot characterization. For a further efficiency gain, the static temperature-to-frequency mapping can be skipped and an estimate of the delay can be obtained by directly comparing the spectrum of the measured crystal frequency and the spectrum of the temperature code measurements. The point at which the frequency and temperature measurements deviate by more 3 dB is then used to extract a delay estimate by assuming a dominant pole in the thermal system.

One approach for analyzing the delay is to analyze the temperature code read by the sensor and the estimated temperature code acquired using the frequency-to-temperature mapping operation. Since frequency measurements of the crystal output may be made during an interval as well as temperature measurements with the sensor during the same interval, it is possible to correlate the response of the quartz crystal to temperature and the die to temperature. By looking at the differences in the response and assuming a dominant low-pass pole, one can estimate the delay or thermal lag between the crystal and the die. That lag data can then be used operationally to compensate for the thermal lag between the crystal and the on-die temperature sensor.

Figure 4:
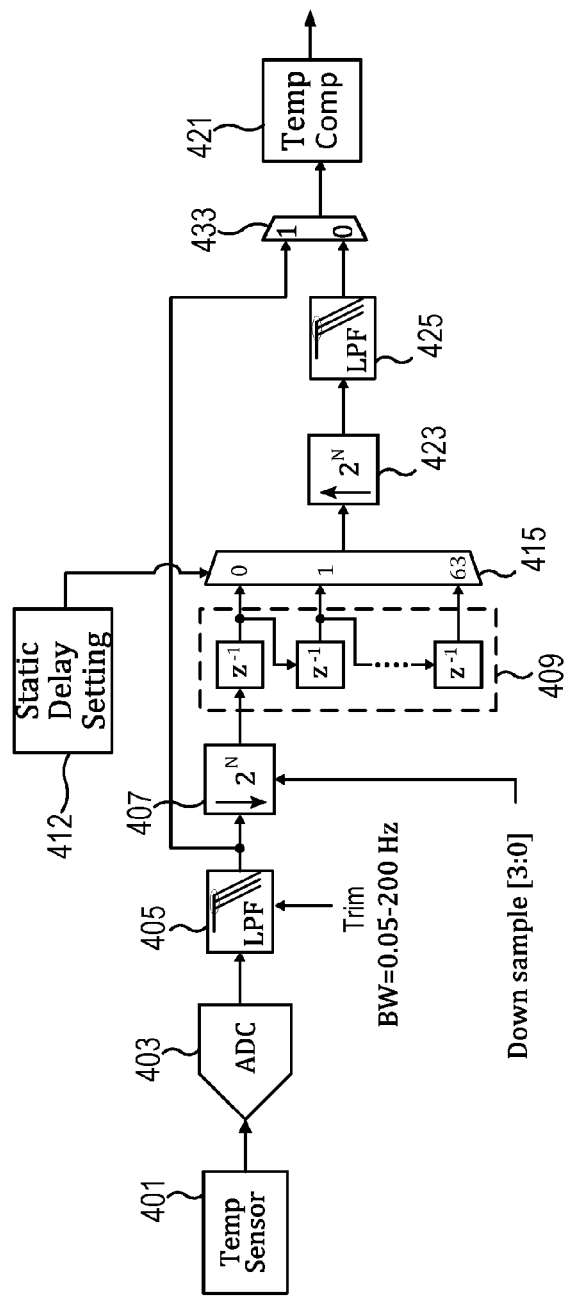
FIG. 4 illustrates an embodiment of the invention that utilizes a memory and a multiplexer circuit to provide a delay where the delay is static.

Referring to FIG. 4, an embodiment is illustrated that compensates for the thermal time delay by the use of an on-die memory that can be realized using a variety of memories such as DRAM, SRAM, shift-registers, synthesized logic, etc. Temperature data is measured using a temperature sensor 401 that supplies an analog to digital converter 403. The data can be low-pass filtered to reduce the memory size requirements of the compensation system in low pass filter 405. The data may also be down sampled in down sampler 407. Because the number of temperature samples available may be much higher than needed given the relatively slow rate of temperature change, down sampler 407 may select, e.g., one out of every one thousand data samples. For example, temperature samples may be available every millisecond while temperature change is in minutes. The temperature data is then loaded serially into the memory 409 that effectively acts as a first-in, first-out (FIFO) system. In an embodiment, delay control logic 412 may be implemented as a static value that selects one of the memory locations in 409 through multiplexer 415. That static value may be based on device characterization and the correlation between the uncompensated XO frequency and the on-die temperature sensor.

By selecting which particular storage element supplies temperature data to temperature compensation logic 421, a linear delay is achieved between when the temperature is measured by temperature sensor 401 and when it is supplied to temperature compensation logic 421. The delay is based on how many temperature measurements are stored before being supplied to the temperature compensation logic. By utilizing the multiplexer circuit 415 to select the memory location of the FIFO structure that supplies temperature compensation logic, the delay becomes selectable and may be based on the device characterization. The delay is determined by the length of the FIFO structure, which is determined by the multiplexer select. A static delay value may be stored in non-volatile memory after device characterization and used to select the delay. Different TCXOs may utilize different static delays according to the device characterization. Note that logic 423 and 425 may be utilized interpolate the decimated signal by upsampling followed by low pass filtering the data before being supplied to temperature compensation logic 421. The temperature compensation logic may use a conventional lookup table or polynomial to adjust the frequency of the TCXO based on temperature. FIG. 4 also illustrates a bypass multiplexer 433 that may be utilized to select the temperature data to bypass the delay.

Figure 5:
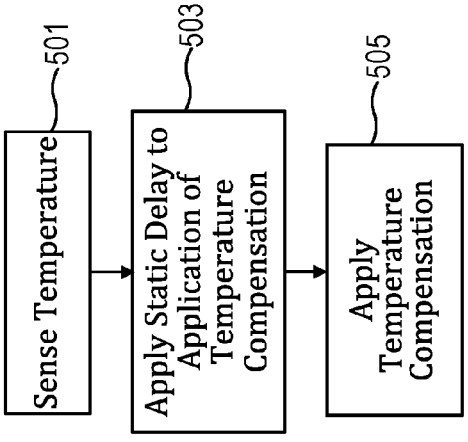
FIG. 5 illustrates a high level flow diagram describing an embodiment of the invention.

FIG. 5 illustrates a high level flow diagram of an embodiment of the invention. The temperature is sampled in 501. A delay is implemented in 503. The delay shown in 503 is a static delay that may be determined during device characterization. After the delay is applied, the temperature-dependent frequency compensation is applied in 505. While an embodiment such as shown in FIG. 4 may be utilized to implement the flow diagram of FIG. 5, other embodiments may utilize a microcontroller using memory to store temperature samples and/or a counter to count the delay. As described further herein, the delay may be static or dynamic and depend on the temperature. Different temperature ranges may exhibit different thermal lag properties.

Figure 6:
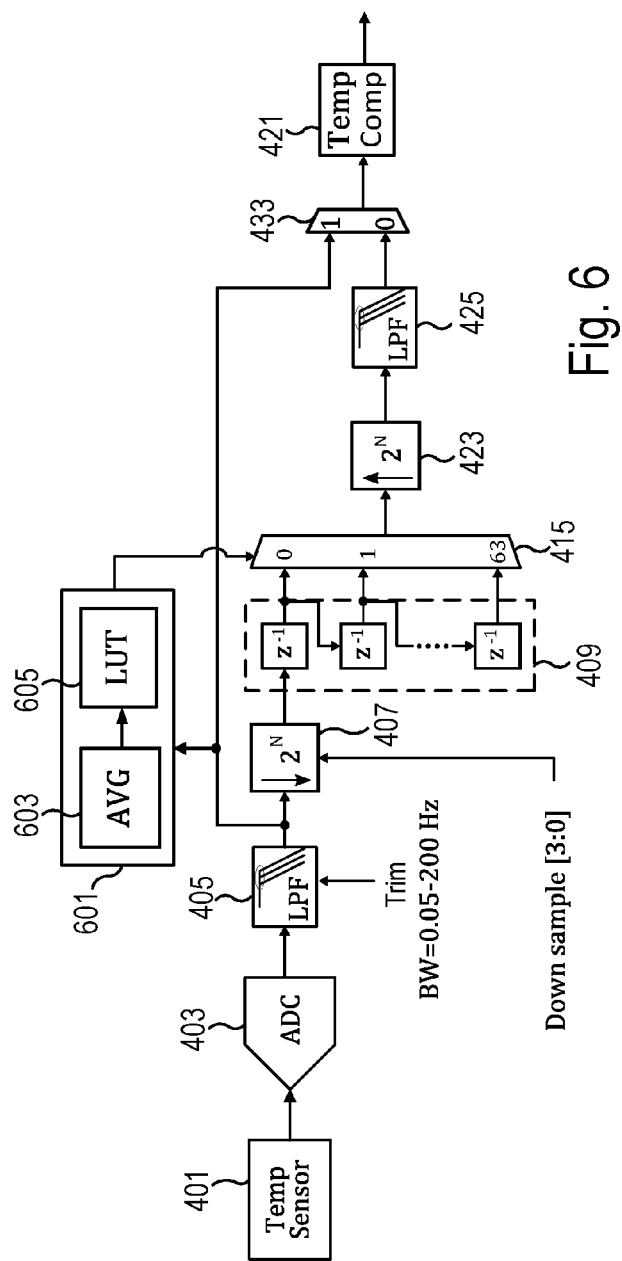
FIG. 6 illustrates an embodiment of the invention that determines a dynamic delay that can vary with temperature.

Referring to FIG. 6, an embodiment is illustrated that determines a dynamic delay that may use a nonlinear mapping between temperature and delay. The embodiment of FIG. 6 uses a delay determining circuit 601 that includes a moving average filter 603 that receives the temperature data supplied to the memory and supplies an output that is used as an index into a look-up table (LUT) 605 or some other realization of a non-linear mapping operation. The output of the look-up table maps the average temperature to a delay number that controls when values passing through the memory are consumed by the temperature compensation logic 421. That effectively controls the delay of the compensation. The dynamic approach allows for a programmable or selectable delay to be applied based on the operating region of the system, since the optimal delay may be different depending on whether the device is hot or cold. The programmable delay is achieved by selecting which memory location of the FIFO structure supplies the temperature compensation logic.

Figure 7:
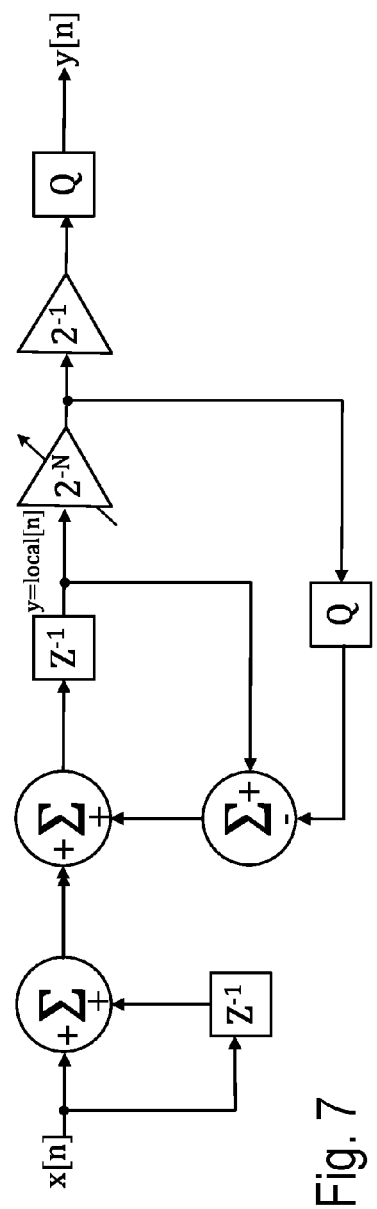
FIG. 7 illustrates a low pass filter that may be used to implement the delay.

Alternatively, a single programmable first-order (or low order) low-pass filter can have its pole location adjusted based on the look-up table described above to implement the delay. An example filter is shown in FIG. 7. The filter may also be used for a static embodiment and have filter coefficients that are programmed through a serial port of the integrated circuit. The delay through the first order low-pass filter increases with decreasing bandwidth. The time-constant through the programmable digital filter can thus be matched to the time-constant observed through the characterization techniques described of the crystal described above and can be dynamic or static.

Figure 8:
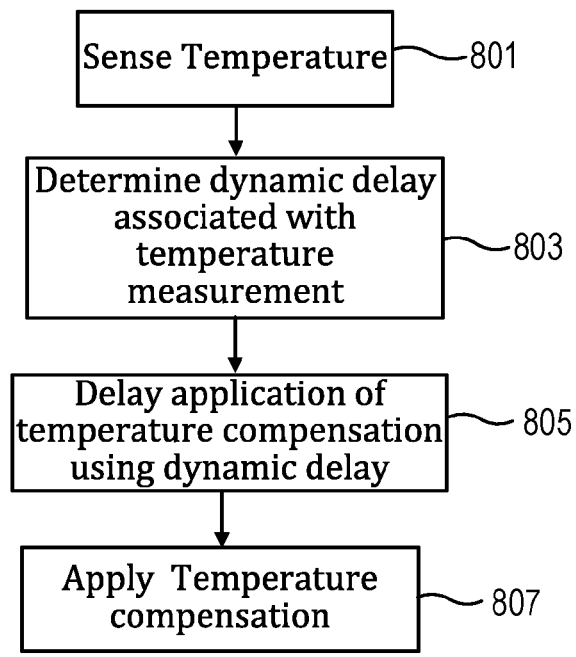
FIG. 8 illustrates a high level flow diagram describing an embodiment of the invention in which the delay is variable across temperature.

FIG. 8 illustrates a high level flow diagram that may be implemented by the embodiment of FIG. 6 or 7. In 801 the temperature is sensed. In 803 the dynamic delay is determined based on the temperature measurement. That may be accomplished as shown in the embodiment of FIG. 6 using an averaging circuit to average the temperature readings and a lookup table that stores delay that corresponds to the average temperature. The lookup table may be based on data generated during device characterization. The dynamic delay is applied in 805 and the temperature compensation is applied in 807.

Figure 9:
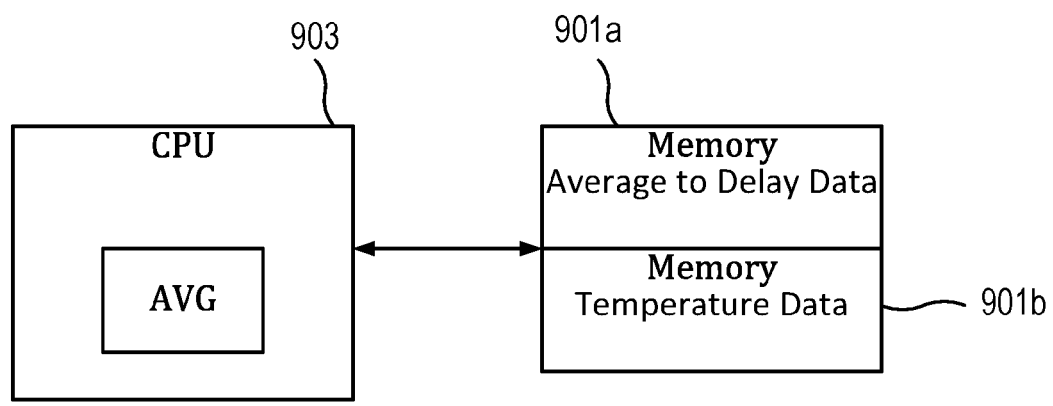
FIG. 9 illustrates an embodiment that utilizes a microcontroller.

Referring to FIG. 9, the embodiment of FIG. 8 may be implemented using a memory 901a and 901b and a microcontroller 903 that determines the average and looks up the delay corresponding to the temperature average in the memory locations 901a. Other memory locations 901b may be used to store the temperature data and assuming a FIFO or shift register structure, the selected location in the FIFO or shift register is supplied to the temperature compensation logic to implement the delay. Of course the structure shown in FIG. 9 may also be used to implement the embodiment shown in FIG. 5 in which case averaging is not needed and a fixed delay value is utilized that may be stored in non-volatile memory. Note that any combination of logic including a programmed microcontroller may be used to implement the functionality described herein for the various embodiments.

Thus, various aspects have been described related to addressing thermal lag in temperature-dependent frequency compensation for temperature compensated crystal oscillators. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method for compensating for temperature-dependent frequency change of a crystal in a temperature compensated crystal oscillator comprising:
   sensing a temperature in a temperature sensor and supplying sensed temperature data;
   delaying application of temperature-dependent frequency compensation using a delay circuit having a selectable delay, the temperature-dependent frequency compensation based on the sensed temperature data, the delay circuit being a low-pass filter;
   selecting a pole location of the low-pass filter to select the selectable delay; and
   selecting the pole location of the low-pass filter according to the sensed temperature data to thereby dynamically delay the application of the temperature-dependent frequency compensation.

2. The method as recited in claim 1, wherein the selectable delay is based on a time lag between when the temperature is sensed and when the temperature affects a crystal used in the crystal oscillator.

3. The method as recited in claim 1, wherein a time lag associated with the delaying application of the temperature-dependent frequency compensation is determined from measured data.

4. The method as recited in claim 1, further comprising measuring the temperature in a temperature sensor on a semiconductor die forming a part of the temperature compensated crystal oscillator.

5. The method as recited in claim 1, further comprising:
   averaging the sensed temperature data and supplying an average; and
   adjusting the selectable delay based on the average.

6. The method as recited in claim 1, further comprising:
   applying the temperature-dependent frequency compensation to a phase-locked loop coupled to the crystal oscillator.

7. A temperature compensated crystal oscillator (TCXO) comprising:
   a crystal oscillator;
   a temperature sensor to provide sensed temperature data; and
   a delay circuit providing a delay to delay temperature-dependent frequency compensation, the temperature-dependent frequency compensation based on the sensed temperature data, the delay to compensate for a difference between when the temperature sensor reflects a change in temperature and when a frequency of a signal supplied by the crystal oscillator is affected by the change in temperature;
   wherein the delay circuit is a low-pass filter and a pole location of the low-pass filter determines the delay; and
   wherein the pole location varies according to the sensed temperature data to thereby adjust the delay according to the sensed temperature data.

8. The TCXO as recited in claim 7, wherein the delay is determined from measured data.

9. The TCXO as recited in claim 7 further comprising:
a phase-locked loop coupled to receive an oscillator signal supplied by the crystal oscillator and to correct a phase-locked loop signal generated by the phase-locked loop according to the temperature; and
wherein the temperature sensor is on a semiconductor die including the phase-locked loop.

10. The TCXO as recited in claim 7, wherein the temperature-dependent frequency compensation is applied by changing a divider value in a feedback divider of a phase-locked loop.

11. A temperature compensated crystal oscillator (TCXO) comprising:
a crystal oscillator;
a temperature sensor to provide sensed temperature data; and
a low-pass filter for delaying temperature-dependent frequency compensation, the temperature-dependent frequency compensation based on the sensed temperature, a delay of the low-pass filter to account for a difference between when the temperature sensor reflects a change in temperature and when a frequency of a signal supplied by the crystal oscillator is affected by the change in temperature;
wherein the delay of the low-pass filter is adjusted based on the sensed temperature data by adjusting a pole location of the low-pass filter.

12. The TCXO as recited in claim 11, wherein the delay varies according to temperature.

* * * * *